(12) United States Patent
Liu et al.

(10) Patent No.: US 10,615,259 B2
(45) Date of Patent: Apr. 7, 2020

(54) SEMICONDUCTOR DEVICE, RELATED MANUFACTURING METHOD, AND RELATED ELECTRONIC DEVICE

(71) Applicant: Semiconductor Manufacturing International (Shanghai) Corporation, Shanghai (CN)

(72) Inventors: Li Liu, Shanghai (CN); Xianyong Pu, Shanghai (CN); Guangli Yang, Shanghai (CN); Gangning Wang, Shanghai (CN); ChiChung Tai, Shanghai (CN); Hong Sun, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 137 days.

(21) Appl. No.: 15/818,403

(22) Filed: Nov. 20, 2017

(65) Prior Publication Data

US 2018/0076284 A1  Mar. 15, 2018

Related U.S. Application Data

(62) Division of application No. 14/988,507, filed on Jan. 5, 2016, now Pat. No. 9,859,372.

(30) Foreign Application Priority Data

Jan. 15, 2015  (CN) .......................... 2015 1 0021267

(51) Int. Cl.
*H01L 29/78* (2006.01)
*H01L 21/762* (2006.01)
(Continued)

(52) U.S. Cl.
CPC .... *H01L 29/0847* (2013.01); *H01L 21/76229* (2013.01); *H01L 29/66659* (2013.01);
(Continued)

(58) Field of Classification Search
CPC .. H01L 21/761; H01L 29/87; H01L 29/66659
See application file for complete search history.

(56) References Cited

U.S. PATENT DOCUMENTS 4,546,538 A * 10/1985 Suzuki ................. H01L 21/033
148/DIG. 117
7,411,271 B1   8/2008 Ma et al.
(Continued)

*Primary Examiner* — Kenneth Parker
*Assistant Examiner* — Long H Le
(74) *Attorney, Agent, or Firm* — Innovation Counsel LLP

(57) ABSTRACT

A semiconductor device may include the following elements: a first doped portion; a second doped portion; an enclosing member, which encloses both the first doped portion and the second doped portion; a first barrier, which directly contacts the first doped portion; a second barrier, which directly contacts the second doped portion; a dielectric member, which is positioned between the first barrier and the second barrier and directly contacts each of the first barrier and the second barrier; a third barrier, which directly contacts the first doped portion; and a device component, wherein a portion of the device component is positioned between the dielectric member and the third barrier.

20 Claims, 6 Drawing Sheets

(51) Int. Cl.
*H01L 29/10* (2006.01)
*H01L 29/66* (2006.01)
*H01L 29/08* (2006.01)
H01L 29/06 (2006.01)

(52) U.S. Cl.
CPC ...... *H01L 29/7835* (2013.01); *H01L 29/0653* (2013.01); *H01L 29/1045* (2013.01)

(56) References Cited

U.S. PATENT DOCUMENTS

| | | |
|---|---|---|
| 9,112,025 B2 | 8/2015 | Wang et al. |
| 9,653,344 B2 | 5/2017 | Yang et al. |
| 2003/0168698 A1 | 9/2003 | Shin et al. |
| 2007/0034911 A1* | 2/2007 | Kao ................... H01L 29/41741 257/288 |
| 2007/0166925 A1* | 7/2007 | Takeda ............ H01L 21/823487 438/270 |
| 2007/0241373 A1* | 10/2007 | Kuroi ................... H01L 21/743 257/288 |
| 2011/0201171 A1* | 8/2011 | Disney .............. H01L 21/76243 438/404 |
| 2013/0200493 A1 | 8/2013 | Sorgellos et al. |

* cited by examiner

S101: Providing a first doped member; providing a first enclosing member that encloses the first doped member; and partially removing each of the first enclosing member and the first doped member to form a first trench and a second trench.

S102: Providing a first barrier material member inside the first trench; and providing a second barrier material member inside the second trench.

S103: Partially removing the first barrier material member for forming a third trench.

S104: Providing a dielectric member inside the third trench.

S105: Providing a portion of a device component between the dielectric member and at least a portion of the second barrier material member.

FIG. 10

SEMICONDUCTOR DEVICE, RELATED MANUFACTURING METHOD, AND RELATED ELECTRONIC DEVICE

CROSS-REFERENCE TO RELATED APPLICATION

This is a divisional application claiming priority to U.S. application Ser. No. 14/988,507 filed on Jan. 5, 2016, which application claims priority to and benefit of Chinese Patent Application No. 201510021267.3, filed on Jan. 15, 2015, each of which are incorporated herein by reference in their entireties.

BACKGROUND OF THE INVENTION

The present invention is related to a semiconductor device, a method for manufacturing the semiconductor device, and an electronic device that includes the semiconductor device.

In a semiconductor device, performance of some elements may be unsatisfactory if the elements are affected by noise. For protecting the elements from noise, one or more isolation pocket structures may be implemented in the semiconductor device, and the elements may be implemented in the one or more isolation pocket structures.

SUMMARY

An embodiment of the present invention may be related to a semiconductor device. The semiconductor device may include the following elements: a first doped portion; a second doped portion; an enclosing member that encloses both the first doped portion and the second doped portion; a first barrier directly contacting the first doped portion; a second barrier directly contacting the second doped portion; a dielectric member positioned between the first barrier and the second barrier and directly contacting each of the first barrier and the second barrier; a third barrier directly contacting the first doped portion; and a portion of a device component positioned between the dielectric member and the third barrier.

The dielectric member may be positioned between the first doped portion and the second doped portion and may directly contact each of the first doped portion and the second doped portion.

A first side of the dielectric member may directly contact both the first barrier and the first doped portion. A second side of the dielectric member may directly contact both the second barrier and the second doped portion.

At least three sides of the dielectric member may directly contact the enclosing member.

The semiconductor device may include a dielectric unit directly contacting the third barrier. The third barrier may be positioned between the dielectric unit and a portion of the doped member. The dielectric unit may be wider than the third barrier.

The semiconductor device may include a dielectric unit positioned between the dielectric member and the third barrier.

A dopant type of the third barrier may be identical to a dopant type of at least one of the first doped portion and the second doped portion.

The device component may be a transistor. A drain terminal of the transistor may include the third barrier.

The device component may be a transistor. A drain terminal of the transistor may include the first doped portion.

An embodiment of the present invention may be related to a method for manufacturing a semiconductor device. The method may include the following steps: providing a first doped member; providing a first enclosing member that encloses the first doped member; partially removing each of the first enclosing member and the first doped member to form a first trench and a second trench in a second enclosing member and a second doped member, wherein the second enclosing member may be a remaining portion of the first enclosing member, and wherein the second doped member may be a remaining portion of the first doped member; providing a first barrier material member inside the first trench; providing a second barrier material member inside the second trench; partially removing the first barrier material member for forming a third trench; providing a dielectric member inside the third trench, wherein the dielectric member may be positioned between a first barrier and a second barrier, wherein the first barrier and the second barrier may be remaining portions of the first barrier material member; and providing a portion of a device component between the dielectric member and at least a portion of the second barrier material member.

The second doped member may be partially removed for forming the third trench. The dielectric member may be positioned between a first doped portion and a second doped portion. The first doped portion and the second doped portion may be remaining portions of the second doped member.

The second enclosing member may be partially removed for forming the third trench. The dielectric member may be positioned between two portions of a third enclosing member. The third enclosing member may be a remaining portion of the second enclosing member.

The method may include the following steps: partially removing the second barrier material member for forming a trench structure; and providing a dielectric unit inside the trench structure.

The method may include the following steps: forming a trench structure between the dielectric member and the portion of the second barrier material member; and providing a dielectric unit inside the trench structure.

A dopant type of the second barrier material member may be identical to a dopant type of the first doped member.

The device component may be a transistor. A drain terminal of the transistor may include the portion of the second barrier material member.

The device component may be a transistor. A drain terminal of the transistor may include a portion of the second doped member.

A first portion of the first barrier material member may be spaced from a second portion of the first barrier material member.

The first trench may be wider than the second trench. Each of the first portion of the first barrier material member and the second portion of the first barrier material member may be thinner than the second barrier material member.

At least three sides of the second barrier material member may directly contact the second doped member.

The method may include the following steps: implanting ions into a semiconductor layer for forming the first doped member; and providing (e.g., through epitaxial growth and/or deposition) semiconductor material on the first doped member for forming the first enclosing member.

An embodiment of the present invention may be related to an electronic device. The electronic device may include an electronic component and a semiconductor device electrically connected to the electronic component. The semiconductor device may have one or more aforementioned features.

According to embodiments of the present invention, isolation pocket structures may be efficiently implemented in semiconductor devices and may effectively protect elements of the semiconductor devices from noise. Advantageously, satisfactory quality of the semiconductor devices and a satisfactory yield of the associated manufacturing process may be substantially attained.

According to embodiments of the present invention, structures with dielectric members in isolation pocket structures in semiconductor devices may minimize or substantially prevent dopant diffusion (which may occur during thermal processes performed for forming device components) in the semiconductor devices. Therefore, distances between isolation pocket structures may be minimized. Advantageously, sizes of semiconductor devices (and sizes of electronic devices that include the semiconductor devices) may be minimized.

According to embodiments of the present invention, doped members of isolation pocket structures in semiconductor device may function as part of drain terminals of the semiconductor devices and may facilitate electric field distribution of the drain terminals. Therefore, undesirable electric current concentration and associated overheating may be substantially prevented. Advantageously, satisfactory reliability of the semiconductor devices may be substantially attained.

The above summary is related to some of many embodiments of the invention disclosed herein and is not intended to limit the scope of the invention.

BRIEF DESCRIPTION OF THE DRAWINGS

FIG. 10 shows a flowchart that illustrates steps in a method for manufacturing a semiconductor device in accordance with one or more embodiments of the present invention.

DETAILED DESCRIPTION

Figure 1:
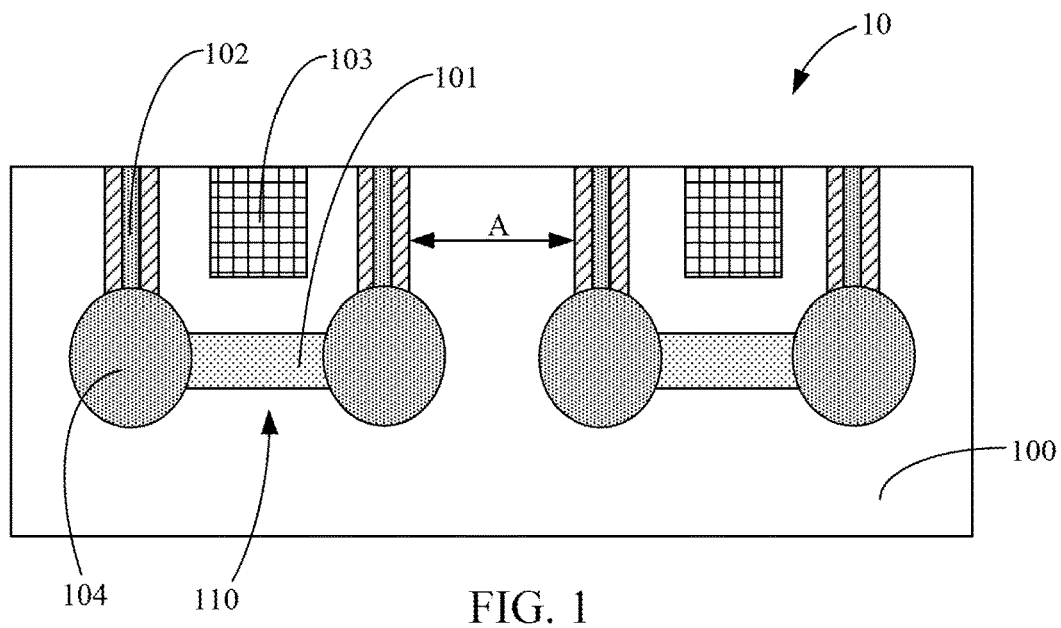
FIG. 1 shows a schematic diagram (e.g., a schematic cross-sectional view) that illustrates elements and/or structures in a semiconductor device in accordance with one or more embodiments of the present invention.

Example embodiments of the present invention are described with reference to the accompanying drawings. As those skilled in the art would realize, the described embodiments may be modified in various different ways, all without departing from the spirit or scope of the present invention. Embodiments of the present invention may be practiced without some or all of these specific details. Well known process steps and/or structures may not have been described in detail in order to not unnecessarily obscure the present invention.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting the present invention. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may also be present between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the invention. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art related to this invention. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive"

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments of the invention may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

FIG. 1 shows a schematic diagram (e.g., a schematic cross-sectional view) that illustrates elements and/or structures in a semiconductor device 10 in accordance with one or more embodiments of the present invention. The semiconductor 10 may include a semiconductor substrate 100, which may be formed of a semiconductor material.

The semiconductor device 10 may further include an isolation pocket structure 110, which may be positioned inside the semiconductor substrate 100. The isolation pocket structure 110 may include a doped bottom member 101 and at least one doped wall member 102. The members 101 and 102 may be connected to each other at one or more junctions 104. The members 101 and 102 may have a same dopant type.

The semiconductor device 10 may further include a device component portion 103, which may be positioned inside the isolation pocket structure 110. The device component portion 103 may be a portion of a device component of the semiconductor device. The device component may be configured for performing one or more particular operations. For example, the device component may be a transistor.

The isolation pocket structure 110 may protect the device component portion 103 against noise. The isolation pocket structure 110 may be spaced from another isolation pocket structure by a distance A, such that optimal isolation between device components may be attained.

Figure 7:
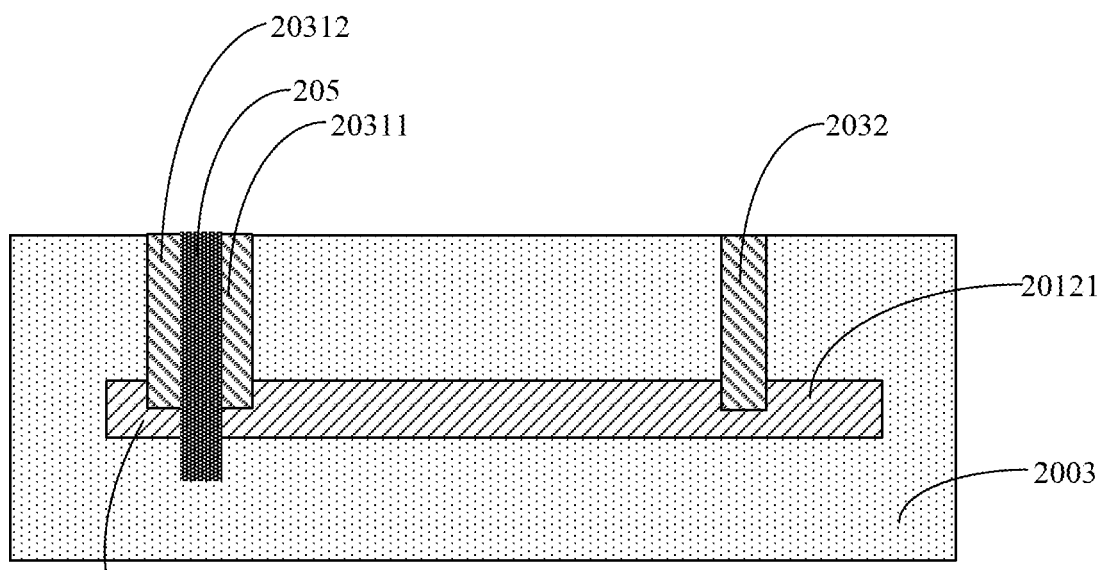
Figure 8:
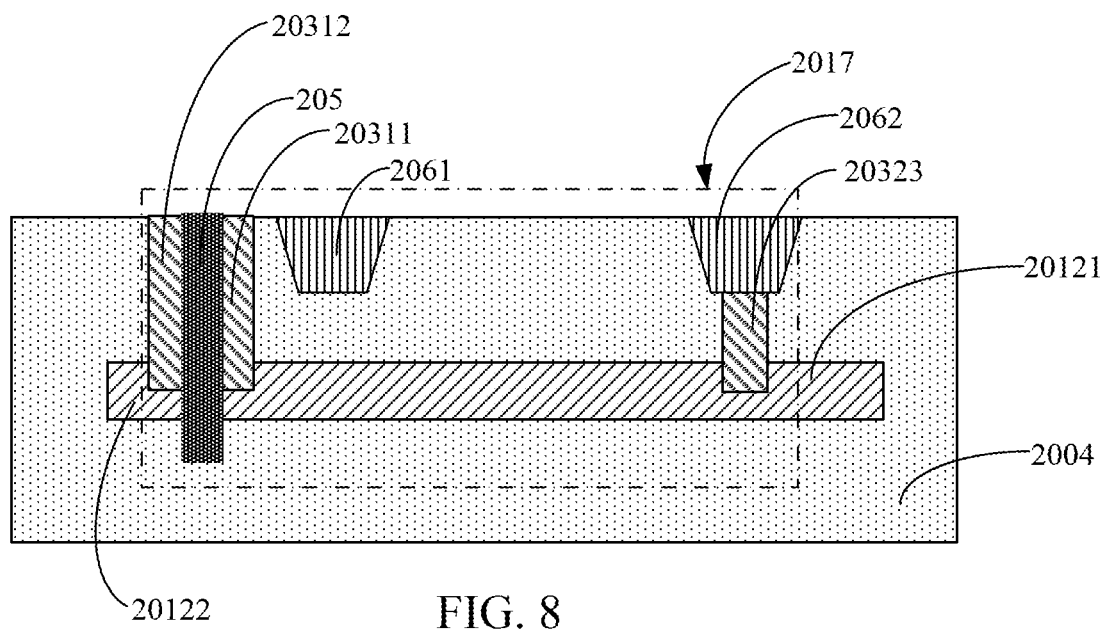
Figure 9:
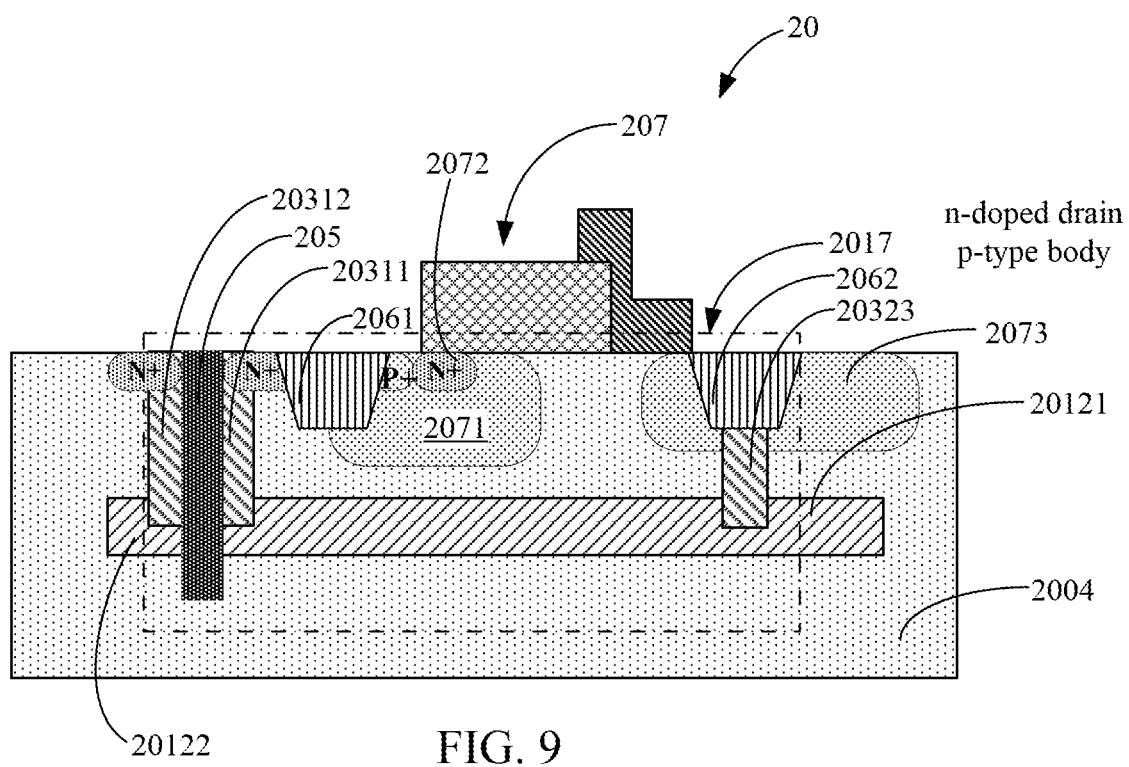
FIG. 9 shows a schematic diagram (e.g., a schematic cross-sectional view) that illustrates elements and/or structures in a semiconductor device in accordance with one or more embodiments of the present invention.

FIG. 2, FIG. 3, FIG. 4, FIG. 5, FIG. 6, FIG. 7, FIG. 8, and FIG. 9 show schematic diagrams (e.g., schematic cross-sectional views) that illustrate elements and/or structures formed in a method for manufacturing a semiconductor device 20 in accordance with one or more embodiments of the present invention. FIG. 9 shows a schematic diagram (e.g., a schematic cross-sectional view) that illustrates elements and/or structures in the semiconductor device 20 in accordance with one or more embodiments of the present invention. FIG. 10 shows a flowchart that illustrates steps in a method for manufacturing the semiconductor device 20 in accordance with one or more embodiments of the present invention.

Referring to FIG. 10, the method may include steps S101, S102, S103, S104, and S105.

Referring to FIG. 10, FIG. 2, FIG. 3, and FIG. 4, the step S101 may include the following steps: providing a first doped member 2011; providing a first enclosing member 2001 that encloses the first doped member 2011; partially removing, e.g., through an etching process, each of the first enclosing member 2001 and the first doped member 2011 to form a first trench 2021 and a second trench 2022 in a second enclosing member 2002 and a second doped member 2012.

The second enclosing member 2002 may be a remaining portion of the first enclosing member 2001. The second doped member 2012 may be a remaining portion of the first doped member 2011. The first trench 2021 may be wider than the second trench 2022.

The etching process may include a dry etching process and/or a wet etching process. The etching process may be performed using a mask 300. The mask 300 may be a hard mask formed of one or more of silicon nitride, etc.

Figure 2:
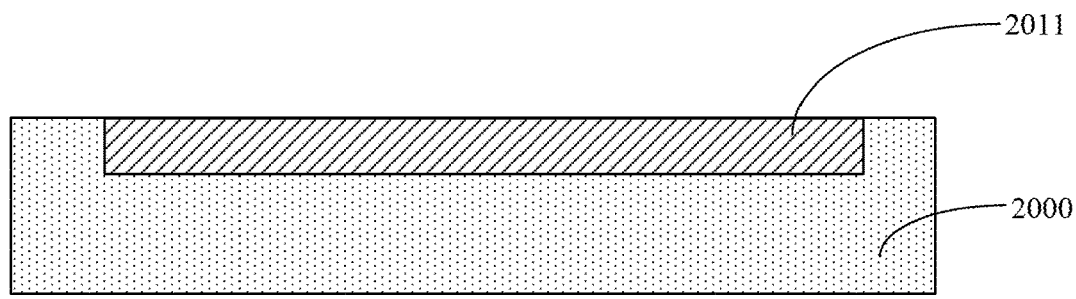
FIG. 2, FIG. 3, FIG. 4, FIG. 5, FIG. 6, FIG. 7, and FIG. 8 show schematic diagrams (e.g., schematic cross-sectional views) that illustrate elements and/or structures formed in a method for manufacturing a semiconductor device in accordance with one or more embodiments of the present invention.
Figure 3:
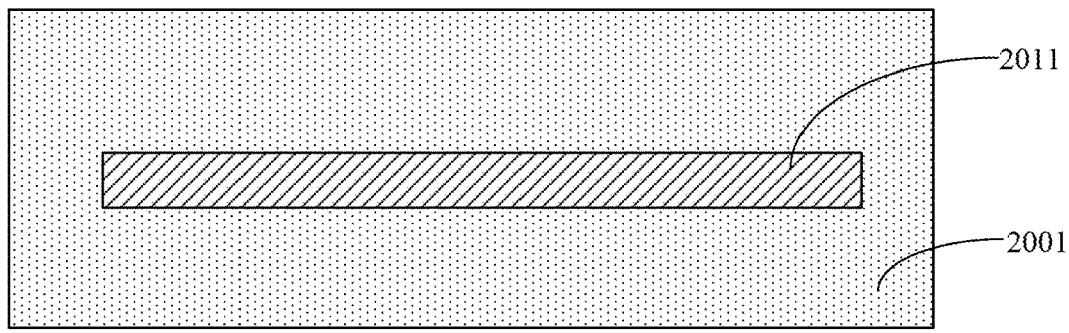

Referring to FIG. 2 and FIG. 3, the method may include the following steps: implanting ions into a semiconductor layer 2000 for forming the first doped member 2011; and providing, e.g., through epitaxial growth and/or deposition, semiconductor material on the first doped member 2011 for forming the first enclosing member 2001. The ions may be n-type ions or p-type ions, such that a dopant type of the first doped member 2011 may be n-type or p-type.

Figure 4:
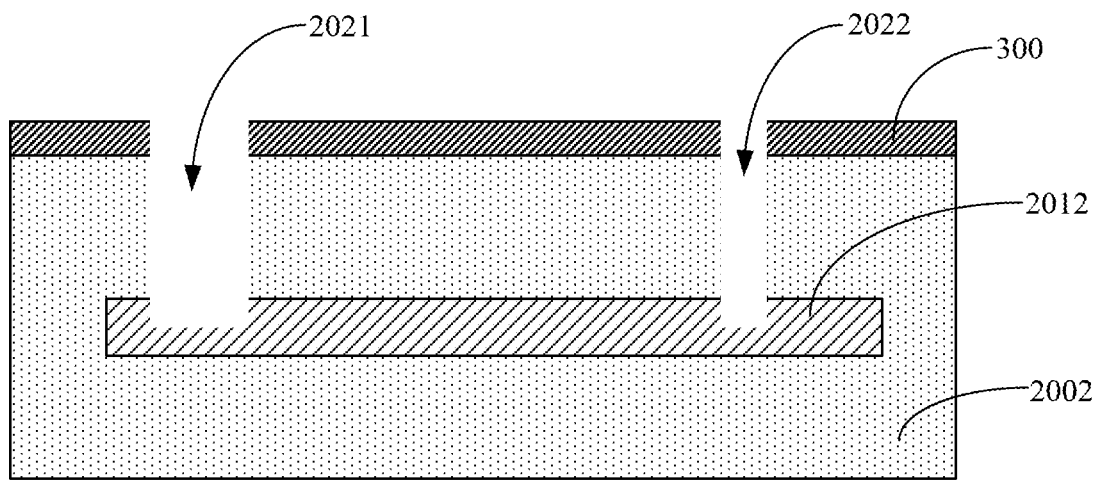
Figure 5:
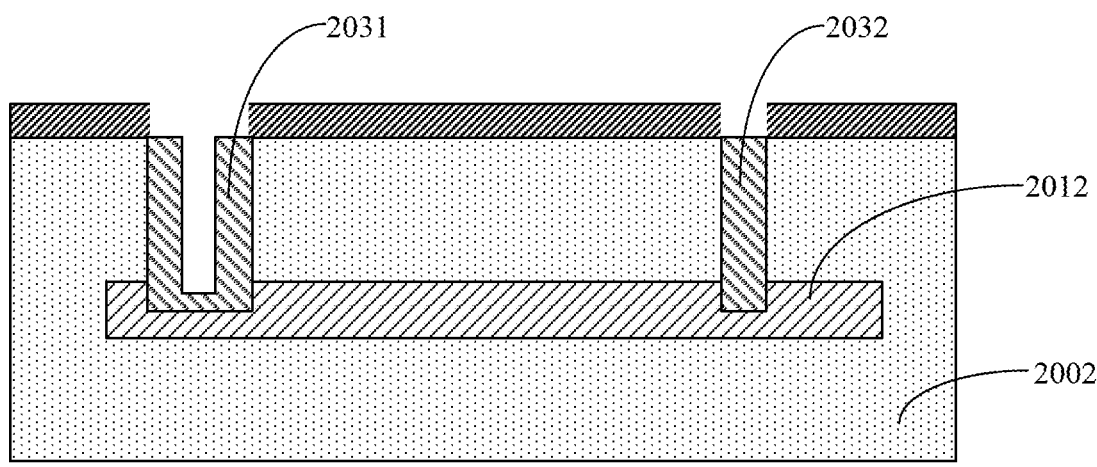

Referring to FIG. 10, FIG. 4, and FIG. 5, the step S102 may include the following steps: providing a first barrier material member 2031 inside the first trench 2021; providing a second barrier material member 2032 inside the second trench 2022.

The first barrier material member 2031 and the second barrier material member 2032 may be substantially simultaneously formed using a same material, e.g., a doped polysilicon material, through a same process, e.g., a deposition process. A dopant type of the second barrier material member 2032 and/or a dopant type of the first barrier material member 2031 may be identical to a dopant type of the second doped member 2012 (and subsequently formed doped portions 20121 and 20122), i.e., the dopant type of the first doped member 2011.

At least three sides of the first barrier material member 2031 may directly contact the second doped member 2012. A first portion (e.g., a first sidewall portion) of the first barrier material member 2031 may be spaced from a second portion (e.g., a second sidewall portion) of the first barrier material member 2031 and may be connected through a third portion (e.g., a bottom portion) of the first barrier material member 2031 to the second portion of the first barrier material member 2031.

At least three sides of the second barrier material member 2032 may directly contact the second doped member 2012. The second barrier material member 2032 may substantially completely fill the second trench 2022. The second barrier material member 2032 may be thicker than each of the first portion of the first barrier material member 2031 and the second portion of the first barrier material member 2031 (in a direction parallel to an interface between the mask 300 and the second enclosing member 2002).

Figure 6:
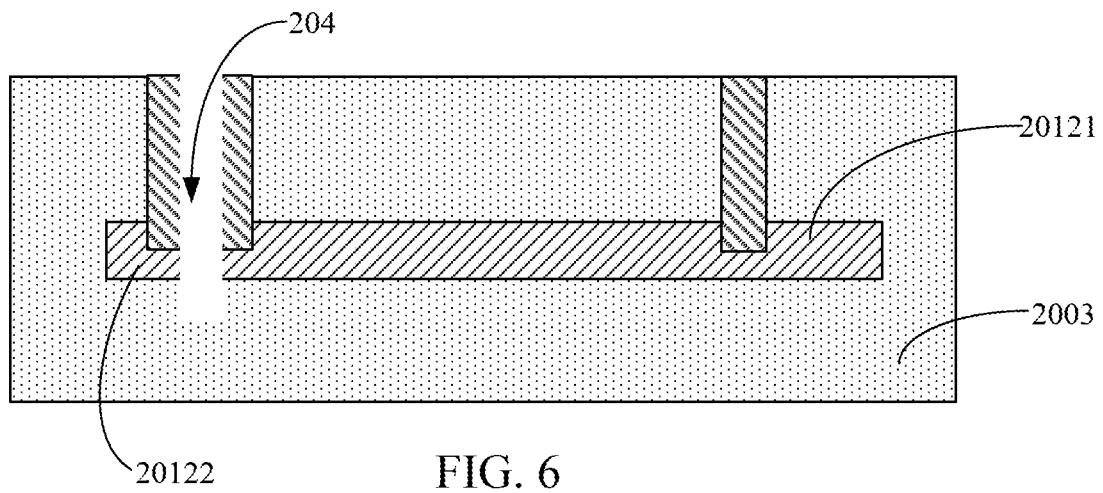

Referring to FIG. 10, FIG. 5, and FIG. 6, the step S103 may include partially removing, e.g., through an etching process, the first barrier material member 2031 for forming a third trench 204. The third portion (e.g., the bottom portion) of the first barrier material member 2031 may be partially or completely removed. The second doped member 2012 may be partially removed, e.g., through the etching process, for forming the third trench 204. The second enclosing member 2002 also may be partially removed, e.g., through the etching process, for forming the third trench 204. The etching process may include a dry etching process and/or a wet etching process.

Referring to FIG. 10, FIG. 6, and FIG. 7, the step S104 may include providing a dielectric member 205 inside the third trench 204. The dielectric member 205 may be formed of one or more of silicon oxide, silicon nitride, etc. The dielectric member 205 may be formed using one or more of a deposition process, a chemical-mechanical polishing (CMP) process, etc.

The dielectric member 205 may be positioned between a first barrier 20311 and a second barrier 20312. The first barrier 20311 and the second barrier 20312 may be remaining portions of the first barrier material member 2031. The dielectric member 205 may directly contact each of the first barrier 20311 and the second barrier 20312.

The dielectric member 205 may be positioned between a first doped portion 20121 and a second doped portion 20122. The first doped portion 20121 and the second doped portion 20122 may be remaining portions of the second doped member 2012. The dielectric member 205 may directly contact each of the first doped portion 20121 and the second doped portion 20122.

The dielectric member 205 may be positioned between two portions of a third enclosing member 2003. The third enclosing member 2003 may be a remaining portion of the second enclosing member 2002. At least three sides of the dielectric member 205 may directly contact the third enclosing member 2003.

A first side of the dielectric member 205 may directly contact all of the first barrier 20311, the first doped portion 20121, and the third enclosing member 2003 (and/or the subsequently formed fourth enclosing member 2004). A second side of the dielectric member 205 may directly contact all of the second barrier 20312, the second doped portion 20122, and the third enclosing member 2003 (and/or the subsequently formed fourth enclosing member 2004).

Referring to FIG. 7 and FIG. 8, the method may include the following steps: partially removing, e.g., though an etching process, each of the second barrier material member 2032 and the third enclosing member 203 for forming a first shallow trench structure; and providing a dielectric unit 2062 inside the first shallow trench structure. The method may include the following steps: forming, e.g., though an etching process, a second shallow trench structure between the dielectric member 205 and a portion of the second barrier material member 2032; and providing a dielectric unit 2061 inside the second shallow trench structure. The remaining portion of the second barrier material member 2032 may be a third barrier 20323. The remaining portion of the third enclosing member may be a fourth enclosing member 2004. The dielectric unit 2062 and the dielectric unit 2061 may be substantially simultaneously formed using one or more of a deposition process, a chemical-mechanical polishing process, etc. Each of the dielectric unit 2062 and the dielectric unit 2061 may be a shallow trench isolation (STI) member.

Referring to FIG. 8, the first barrier 20311, the dielectric member 205, the second barrier 20312, the first doped portion 20121, the second doped portion 20122, the third barrier 20323, and/or the dielectric unit 2062 (or STI member 2062) may form an isolation pocket structure 2017. The isolation pocket structure 2017, with dielectric elements and doped elements, may enable effective isolation against noise. The dielectric elements may effectively minimize or substantially prevent dopant diffusion.

Referring to FIG. 10, FIG. 8, and FIG. 9, the step S105 may include providing a portion of a device component 207 between the dielectric member 205 and the third barrier 20323 (which is a portion of the second barrier material member 2032), such that the portion of the device component 207 may be positioned inside the isolation pocket structure 2017.

The device component 207 may be a logic component. The dielectric units 2061 and 2062 (or STI members 2061 and 2062) may define an active area of the device component 207. The device component 207 may be a transistor, such as metal-oxide semiconductor field effect transistor (MOSFET) and/or a laterally diffused metal oxide semiconductor (LDMOS) semiconductor. The portion of the device component 207 may include, for example, a doped body 2071 (e.g., a p-type body) and/or one or more (highly) doped regions 2072.

The device component 207 (e.g., a transistor) may include a doped drain 2073 (e.g., an n-doped drain). A first portion of the doped drain 2073 may be positioned inside the isolation pocket structure 2017, and a second portion of the doped drain 2073 may be positioned outside the isolation pocket structure 2017. The dielectric unit 2062 may be positioned between the first portion of the doped drain 2073 and the second portion of the doped drain 2073 and may directly contact each of the first portion of the doped drain 2073 and the second portion of the doped drain 2073. The third barrier 20323 may be positioned between the first portion of the doped drain 2073 and the second portion of the doped drain 2073 and may directly contact each of the first portion of the doped drain 2073 and the second portion of the doped drain 2073.

The isolation pocket structure 2017 may effectively protect portions of the device component 207 against noise and/or cross talk. Advantageously, satisfactory performance of the device component 207 and/or the semiconductor device 20 may be attained. The isolation pocket structure 2017 may effectively minimize or substantially prevent dopant diffusion. Therefore, minimum spacing between the isolation pocket structure 2017 and other isolation pocket structures of the semiconductor device 20 may be required. Advantageously, the size of the semiconductor device 20 may be minimized.

A drain terminal of the device component 207 (e.g., a transistor) may include at least one of the third barrier 20323 (i.e., a portion of the second barrier material member 2032) and the first doped portion 20121 (i.e., a portion of the second doped member 2012). The third barrier 20323 and/or the first doped portion 20121 may facilitate electric field distribution of the drain terminal of the device component 207. Therefore, undesirable electric current concentration and associated overheating may be prevented. Advantageously, satisfactory reliability of the device component 207 and/or the semiconductor device 20 may be attained.

Referring to FIG. 9, the semiconductor device 20 may include the following elements: the first doped portion 20121; the second doped portion 20122; the enclosing member 2004, which may enclose both the first doped portion 20121 and the second doped portion 20122; the first barrier 20311, which may directly contact the first doped portion 20121; the second barrier 20312, which may directly contact the second doped portion 20122; the dielectric member 205, which may be positioned between the first barrier 20311 and the second barrier 20312 and may directly contact each of the first barrier 20311 and the second barrier 20312; the third barrier 20323, which may directly contact the first doped portion 20121; and the device component 207, wherein one or more portions of the device component 207 may be positioned between the dielectric member 205 and the third barrier 20323 (or positioned inside the isolation pocket structure 2017). The semiconductor device 20 may have one or more of the aforementioned features and/or one or more of the aforementioned advantages.

Figure 11:
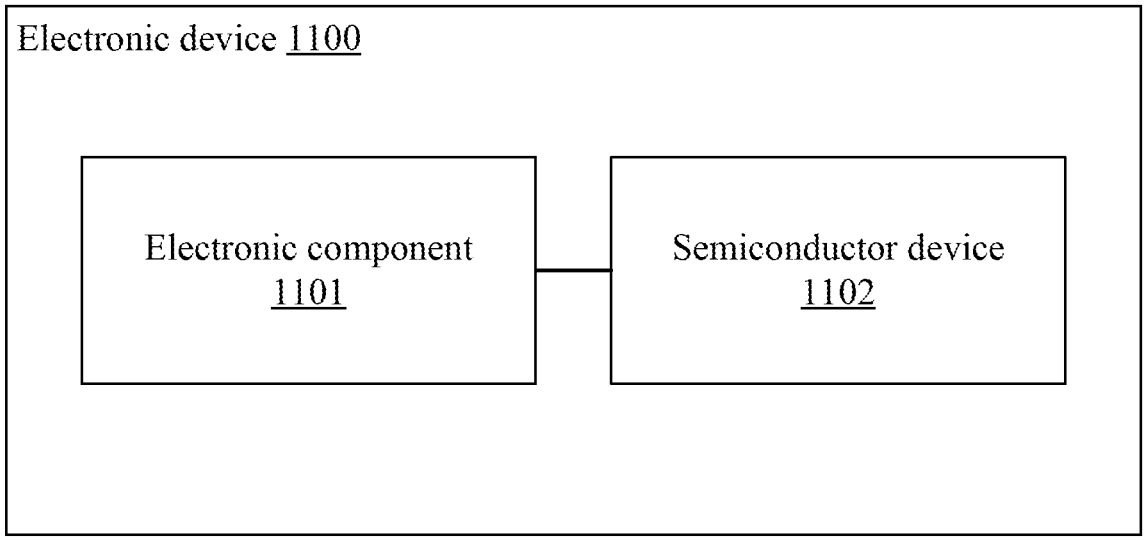
FIG. 11 shows a schematic block diagram that illustrates elements in an electronic device in accordance with one or more embodiments of the present invention.

FIG. 11 shows a schematic block diagram that illustrates elements in an electronic device 1100 in accordance with one or more embodiments of the present invention. The electronic device 1100 may include an electronic component 1101 and a semiconductor device 1102 that is electrically connected to the electronic component 1101. The semiconductor device 1102 may have one or more of the above-discussed features and advantages.

In an embodiment, the electronic device 1100 may be or may include one or more of a mobile phone, a tablet computer, a notebook computer, a netbook, a game console, a television, a video compact disc (VCD) player, a digital video disc (DVD) player, a navigation device, a camera, a camcorder, a voice recorder, an MP3 player, an MP4 player, a portable game device, etc.

In an embodiment, the electronic device 1100 may be or may include an intermediate product (e.g., a mobile phone main board) or module.

According to embodiments of the present invention, isolation pocket structures may be efficiently implemented in semiconductor devices and may effectively protect elements of the semiconductor devices from noise. Advantageously, satisfactory quality of the semiconductor devices and a satisfactory yield of the associated manufacturing process may be substantially attained.

According to embodiments of the present invention, structures with dielectric members in isolation pocket structures in semiconductor devices may minimize or substantially prevent dopant diffusion (which may occur during thermal processes performed for forming device components) in the semiconductor devices. Therefore, distances between isolation pocket structures may be minimized. Advantageously, sizes of semiconductor devices (and sizes of electronic devices that include the semiconductor devices) may be minimized.

According to embodiments of the present invention, doped members of isolation pocket structures in semiconductor device may function as part of drain terminals of the semiconductor devices and may facilitate electric field distribution of the drain terminals. Therefore, undesirable electric current concentration and associated overheating may be substantially prevented. Advantageously, satisfactory reliability of the semiconductor devices may be substantially attained.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A method for manufacturing a semiconductor device, the method comprising:
   providing a first doped member;
   providing a first enclosing member that encloses the first doped member;
   partially removing each of the first enclosing member and the first doped member to form a first trench and a second trench in a second enclosing member and a second doped member, wherein the second enclosing member is a remaining portion of the first enclosing member, and wherein the second doped member is a remaining portion of the first doped member, wherein a first portion of the second doped member is positioned between a first portion of the second enclosing member and the first trench in a depth direction associated with a depth of the first trench;
   providing a first barrier material member inside the first trench;
   providing a second barrier material member inside the second trench;
   partially removing the first barrier material member for forming a third trench;
   providing a dielectric member inside the third trench, wherein the dielectric member is positioned between a first barrier and a second barrier, wherein the first barrier and the second barrier are remaining portions of the first barrier material member; and
   providing a portion of a device component between the dielectric member and at least a portion of the second barrier material member.

2. The method of claim 1, wherein the second doped member is partially removed for forming the third trench, wherein the dielectric member is positioned between a first doped portion and a second doped portion, and wherein the first doped portion and the second doped portion are remaining portions of the second doped member.

3. The method of claim 1, wherein the second enclosing member is partially removed for forming the third trench, wherein the dielectric member is positioned between two portions of a third enclosing member, and wherein the third enclosing member is a remaining portion of the second enclosing member.

4. The method of claim 1, comprising: partially removing the second barrier material member for forming a trench structure; and providing a dielectric unit inside the trench structure.

5. The method of claim 1, comprising: forming a trench structure between the dielectric member and the portion of the second barrier material member; and providing a dielectric unit inside the trench structure.

6. The method of claim 1, wherein a dopant type of the second barrier material member is identical to a dopant type of the first doped member.

7. The method of claim 1, wherein the device component is a transistor, wherein a drain terminal of the transistor includes at least one of the portion of the second barrier material member and a portion of the second doped member.

8. The method of claim 1, wherein a first portion of the first barrier material member is spaced from a second portion of the first barrier material member.

9. The method of claim 8, wherein the first trench is wider than the second trench, and wherein each of the first portion of the first barrier material member and the second portion of the first barrier material member is thinner than the second barrier material member.

10. The method of claim 1, wherein at least three sides of the second barrier material member directly contact the second doped member.

11. The method of claim 1, comprising: implanting ions into a semiconductor layer for forming the first doped member; and providing semiconductor material on the first doped member for forming the first enclosing member.

12. The method of claim 1, wherein a second portion of the second doped member is positioned between the first trench and the second trench, and wherein the second portion of the second doped member is thicker than the first portion of the second doped member in the depth direction.

13. The method of claim 1, wherein a second portion of the second doped member is positioned between the first trench and a second portion of the second enclosing member in a direction perpendicular to the depth direction.

14. The method of claim 13, wherein the second portion of the second doped member is thicker than the first portion of the second doped member in the depth direction.

15. The method of claim 1, wherein the first enclosing member directly contacts at least three faces of the first doped member when the first enclosing member encloses the first doped member.

16. The method of claim 1, wherein the second doped member directly contacts at least three faces of the first barrier material member when the first barrier material member is provided inside the first trench.

17. A method for manufacturing a semiconductor device, the method comprising:
providing a first doped member;
providing a first enclosing member that encloses the first doped member;
partially removing each of the first enclosing member and the first doped member to form a first trench and a second trench in a second enclosing member and a second doped member, wherein the second enclosing member is a remaining portion of the first enclosing member, and wherein the second doped member is a remaining portion of the first doped member;
providing a first barrier material member inside the first trench;
providing a second barrier material member inside the second trench;
partially removing the first barrier material member and partially removing at least one of the second doped member and the second enclosing member for forming a third trench;
providing a dielectric member inside the third trench, wherein the dielectric member is positioned between a first barrier and a second barrier, wherein the first barrier and the second barrier are remaining portions of the first barrier material member; and
providing a portion of a device component between the dielectric member and at least a portion of the second barrier material member.

18. The method of claim 17, wherein the dielectric member is positioned between a first doped portion and a second doped portion, and wherein the first doped portion and the second doped portion are remaining portions of the second doped member.

19. The method of claim 17, wherein the dielectric member is positioned between two portions of a third enclosing member, and wherein the third enclosing member is a remaining portion of the second enclosing member.

20. A method for manufacturing a semiconductor device, the method comprising:
providing a first doped member;
providing a first enclosing member that encloses the first doped member;
partially removing each of the first enclosing member and the first doped member to form a first trench and a second trench in a second enclosing member and a second doped member, wherein the second enclosing member is a remaining portion of the first enclosing member, and wherein the second doped member is a remaining portion of the first doped member;
providing a first barrier material member inside the first trench;
providing a second barrier material member inside the second trench;
partially removing the first barrier material member for forming a third trench;
providing a dielectric member inside the third trench, wherein the dielectric member is positioned between a first barrier and a second barrier, wherein the first barrier and the second barrier are remaining portions of the first barrier material member;
forming a trench structure between the dielectric member and at least a portion of the second barrier material member; and
providing a dielectric unit inside the trench structure.

\* \* \* \* \*